(12) United States Patent
Kwon et al.

(10) Patent No.: US 8,831,816 B2
(45) Date of Patent: Sep. 9, 2014

(54) ELECTRICAL LEAKAGE DIAGNOSIS APPARATUS FOR VEHICLE USING INSULATION RESISTANCE SENSOR AND CONTROL METHOD THEREOF

(71) Applicants: Hyundai Motor Company, Seoul (KR); Kia Motors Corporation, Seoul (KR)

(72) Inventors: Beomjoo Kwon, Seoul (KR); Hyunsoo Park, Gyeonggi-do (KR); Oyoung Ahn, Gyeonggi-do (KR); Kyungho Kim, Jeonbuk (KR); Myeongsun Choi, Gyeonggi-do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 13/676,442

(22) Filed: Nov. 14, 2012

(65) Prior Publication Data
US 2014/0039740 A1    Feb. 6, 2014

(30) Foreign Application Priority Data
Aug. 1, 2012    (KR) .......................... 10-2012-0084299

(51) Int. Cl.
| | | |
|---|---|---|
| B60W 10/24 | (2006.01) |
| H02H 7/18 | (2006.01) |
| B60W 10/26 | (2006.01) |
| B60W 20/00 | (2006.01) |
| H02J 7/00 | (2006.01) |
| B60T 8/88 | (2006.01) |

(52) U.S. Cl.
CPC ............... *B60W 10/26* (2013.01); *B60W 20/00* (2013.01); *H02J 7/0031* (2013.01); *B60T 8/885* (2013.01)
USPC ............ 701/29.2; 701/22; 701/29.1; 701/36; 180/65.29; 307/10.7

(58) Field of Classification Search
USPC ................. 701/22, 36, 29.1, 29.2, 29.7, 29.8, 701/30.5–31.1, 33.9; 180/65.29, 65.31, 180/65.265; 320/104; 903/903, 907; 340/455, 635, 636.1–636.2; 700/57–65; 361/91.2, 49; 324/549, 551
See application file for complete search history.

(56) References Cited

U.S. PATENT DOCUMENTS

| | | | |
|---|---|---|---|
| 6,970,807 B2 * | 11/2005 | Kito et al. ..................... 702/183 |
| 7,012,435 B2 * | 3/2006 | Yamamoto et al. ........... 324/527 |

(Continued)

FOREIGN PATENT DOCUMENTS

| | | |
|---|---|---|
| JP | 2005-304138 A | 10/2005 |
| JP | 2006101632 A | 4/2006 |
| JP | 2009085830 A | 4/2009 |
| JP | 2009300400 A | 12/2009 |

(Continued)

*Primary Examiner* — Thomas Tarcza
*Assistant Examiner* — Tyler J Lee
(74) *Attorney, Agent, or Firm* — Edwards Wildman Palmer LLP; Peter F. Corless

(57) ABSTRACT

Disclosed is an electrical leakage diagnosis apparatus for a vehicle which uses an insulation resistance sensor. The apparatus includes an insulation resistance sensor; a main switching part; and a battery power management part configured to terminate the operation of a driving part so as to control a driving motor of a vehicle when the value of a first insulation resistance outputted from the insulation resistance sensor is less than a previously set threshold value, and to determine that an insulation breakage has occurred in one or more driving components when the value of a second insulation resistance, measured after terminations of the driving components, exceeds the threshold value and to terminate the operation of the vehicle by turning off the main switching part so that electrical power supplied from the high voltage battery to the electrical field loads of a vehicle is disconnected.

15 Claims, 5 Drawing Sheets

(56) References Cited

U.S. PATENT DOCUMENTS

| | | | |
|---|---|---|---|
| 7,471,003 B2 * | 12/2008 | Kobayashi et al. | 290/40 C |
| 7,536,251 B2 * | 5/2009 | Saito et al. | 701/104 |
| 7,923,161 B2 * | 4/2011 | Hirakata | 429/430 |
| 8,373,950 B2 * | 2/2013 | Yano et al. | 361/42 |
| 2005/0073320 A1 * | 4/2005 | Yamamoto et al. | 324/557 |
| 2009/0002903 A1 * | 1/2009 | Uchida | 361/49 |
| 2009/0108850 A1 * | 4/2009 | Yamagami et al. | 324/551 |
| 2010/0063660 A1 * | 3/2010 | Uchida | 701/22 |
| 2012/0109435 A1 * | 5/2012 | Mikulec et al. | 701/22 |

FOREIGN PATENT DOCUMENTS

| | | |
|---|---|---|
| JP | 2010-239820 A | 10/2010 |
| KR | 20-1999-0025011 U | 7/1999 |
| KR | 10-2005-0080950 | 8/2005 |
| KR | 10-2008-0030753 | 4/2008 |
| KR | 10-2008-0091392 A | 10/2008 |
| KR | 10-2009-0012456 | 2/2009 |
| KR | 10-2010-0105957 | 10/2010 |
| KR | 10-1101270 | 1/2012 |
| KR | 10-2012-0030198 | 3/2012 |

* cited by examiner

ELECTRICAL LEAKAGE DIAGNOSIS APPARATUS FOR VEHICLE USING INSULATION RESISTANCE SENSOR AND CONTROL METHOD THEREOF

CROSS-REFERENCE(S) TO RELATED APPLICATIONS

This application claims priority to Korean Patent Application No. 10-2012-0084299, filed on Aug. 1, 2012, which is incorporated herein by reference in its entirety.

BACKGROUND OF THE INVENTION

1. Field of the Invention

The present invention relates to an electrical leakage diagnosis apparatus for a vehicle using an insulation resistance sensor and a control method thereof and particularly to an electrical leakage diagnosis apparatus for a vehicle using an insulation resistance sensor and a control method thereof which make it possible to measure a leakage of a high voltage battery for hybrid and electric vehicles.

2. Description of Related Art

A diagnosis apparatus for a vehicle using an insulation resistance sensor is often installed in hybrid or electric vehicles which use a high voltage battery. This diagnosis apparatus is configured to prevent damage which may occur due to electrical leakage by detecting breakage in the insulation.

The above mentioned diagnosis apparatus as a result prevents accidents from occurring due to electrical leakage by disconnecting a power supply from a high voltage battery while monitoring an insulation resistance during driving operation and at idle and generating an alarm when the value of the monitored insulation resistance is below a threshold insulation resistance value.

However, a high voltage circuit in the conventional apparatus is disconnected when an insulation resistance falls below the threshold value even though a vehicle may still be moving. As a result, the driver may loose control possibly causing the vehicle to crash.

SUMMARY OF THE INVENTION

Accordingly, it is an object of the present invention to provide a diagnosis apparatus for a vehicle and a control method thereof which minimizes the risk of accidents occurring due to a disconnection of a high voltage circuit by allowing the system to operate in a proper limp-home mode with the aid of a logic programmed to recognize, based on the type of breakage detected, where in the system the breakage has occurred once a break has been detected. More specifically, the high voltage element associated with the insulation breakage can be quickly searched, thus allowing the system to be easily diagnosed and repaired.

To achieve the above objects, there is provided an electrical leakage diagnosis apparatus for a vehicle, comprising an insulation resistance sensor configured to measure an insulation resistance between a high voltage battery and a chassis of a vehicle and output the measured insulation resistance. The apparatus also includes a main switching part that is configured to selectively supply the electrical power from the high voltage battery to electrical field loads within the vehicle in accordance with an external control device, and a battery power management part configured to terminate operation of one or more driving components within the vehicle to control a driving motor of the vehicle when the value of a first insulation resistance outputted from the insulation resistance sensor is less than a previously set threshold value. The battery power management part is also configured to determine that an insulation breakage has occurred in the driving part when the value of a second insulation resistance measured after termination of the driving components exceeds the threshold value and to terminate operation of the vehicle by turning off the main switching part so that the electrical power supplied from the high voltage battery to the electrical field loads of a vehicle is terminated.

The battery power management part may also be configured to generate a first diagnostics trouble code to provide a warning that a leakage has occurred in the vehicle before termination of the driving components when the value of the first insulation resistance from the insulation resistance sensor is less than the threshold value.

The battery power management part may also be configured to generate a second diagnostics trouble code to provide a warning that a leakage has occurred parting the driving components after the operation of the vehicle has been terminated by turning off the main switching part.

The battery power management part may be configured to select any one of the high voltage elements except for the driving components within the electrical field loads of a vehicle when the value of the second insulation resistance is less than the threshold value, to terminate operation of the first high voltage element, and to determine that an insulation breakage has occurred in the first high voltage element when the value of a third insulation resistance measured by the insulation resistance sensor after the operation of the first high voltage element is terminated exceeds the threshold value. The battery management part may then be configured to reinitiate operation of that particular driving component, when battery power management part determines that the insulation breakage has occurred in the first high voltage element.

The battery power management part may also be configured to generate a third diagnostics trouble code to provide a warning that a leakage has occurred in the first high voltage element before the operation of the driving component is reinitiated from a terminated state, when the battery power management part determines that the insulation resistance has occurred in the first high voltage element.

The battery power management part may further be configured to terminate sequentially the operations of the high voltage elements except for driving components in the electrical field loads of a vehicle, and to disconnect an electrical power supply from the high voltage battery when the value of the third insulation resistance is less than the threshold value with respect to a corresponding high voltage element, and to receive a fourth insulation resistance measured by the insulation resistance sensor after the electrical power supply from the high voltage battery is disconnected, and to terminate the operations of a vehicle when the batter management part determines that the insulation breakage has occurred in the high voltage battery as the value of the received fourth insulation resistance exceeds the threshold value.

The battery power management part may even further be configured to generate a fourth diagnostics trouble code to provide a warning that a leakage has occurred in the high voltage battery after the operation of the vehicle has been terminated since the battery power management part has determined that the insulation breakage has occurred in the high voltage battery.

The battery power management part may additionally be configured to determine that an insulation breakage has occurred in other device, in which the disconnection of the high voltage circuit is impossible or inappropriate, in accordance with an electrical control in the electrical field loads of a vehicle when the value of the fourth insulation resistance is below the threshold value and then to terminate the operation of the vehicle as a result of the determination.

The battery power management part also be configured to generate a fifth diagnostics trouble code to provide a warning that a leakage has occurred in the other apparatuses after the operation of a vehicle has been terminated since a determination has been made that the insulation breakage has occurred in the other apparatuses.

Advantageously, the illustrative embodiments of the present invention allow one to identify in which high voltage element an insulation is broken once an insulation breakage has been detect to allow the vehicle to activate a limp-home mode when the insulation of a high voltage element which is not directly related with the operation of a vehicle is broken. So, the present invention can help prevent accidents from occurring due to an unconditional disconnection by a conventional system when a leakage due to an insulation resistance occurs.

In addition, the present invention is directed to identifying a leakage information by the device with respect to a device which is directly related with a high voltage system such as a driving part, an air conditioner compressor and a PTC heater, and a leakage alarm can be programmed to generate by the device, which results in an enhanced user convenience when in use.

DESCRIPTION OF SPECIFIC EMBODIMENTS

Figure 1:
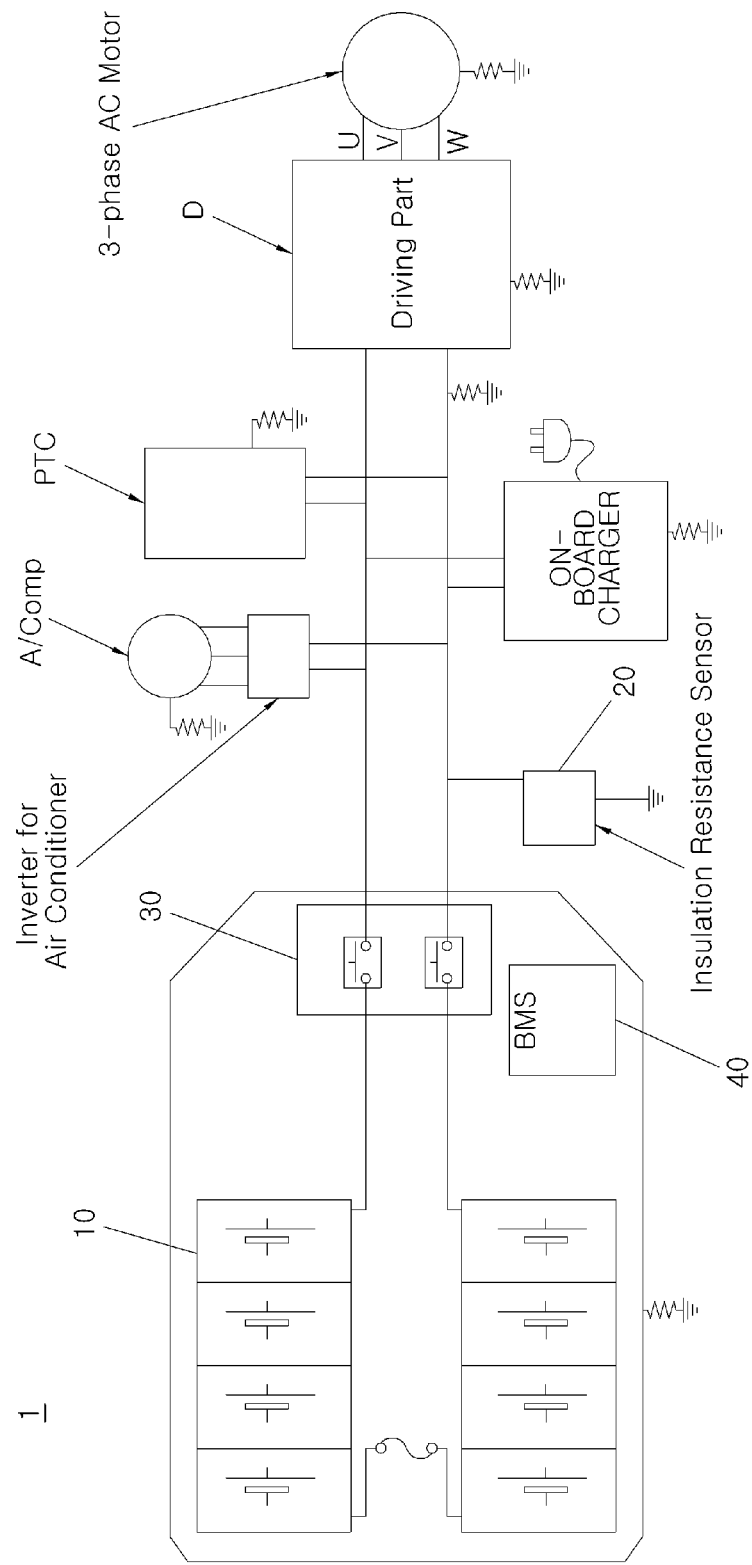
FIG. 1 is a block diagram illustrating a diagnosis apparatus for a vehicle using an insulation resistance sensor according to an exemplary embodiment of the present invention.

The diagnosis apparatus for a vehicle using an insulation resistance sensor according to an embodiment of the present invention will be described with reference to the accompanying drawings. FIG. 1 is a block diagram illustrating a diagnosis apparatus for a vehicle using an insulation resistance sensor according to an embodiment of the present invention.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Although the below exemplary embodiments are described as using a singular units to perform the above process, it is understood that the above processes may also be performed by a plurality of controllers or units.

Furthermore, the control logic of the present invention may be embodied as non-transitory computer readable media on a computer readable medium containing executable program instructions executed by a processor, controller or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

Referring to FIG. 1, a diagnosis apparatus 1 for a vehicle using an insulation resistance sensor 20 according to an exemplary embodiment of the present invention includes a high voltage battery 10, the insulation resistance sensor 20, a main switching part 30 and a battery power management part. In FIG. 1, as an example of a high voltage element within electrical field loads of the vehicle, there are shown an air conditioner compressor 50 including a driving component 60 and a PTC (Positive Temperature Coefficient) heater 70.

Here the high voltage battery 10 is configured to operate in accordance with a control of the battery power management part 40 and to supply electrical power to an air conditioner compressor 50 including a driving component (i.e., a driving part) 60, and a PTC heater 70. The high voltage source generally used for a hybrid vehicle or an electric vehicle should be insulated from a low voltage source for a vehicle as well.

The insulation resistance sensor 20 is configured to measure the insulation resistance between the high voltage battery 10 of the vehicle and the chassis of the vehicle and to output the measurement to the battery power management part 40. In other words, the insulation resistance sensor 20 is configured to measure leakage of electricity from the high voltage battery 10. The battery power management part 40 may be embodied as a controller installed within the vehicle that includes a processor and memory which are configured to execute one or more of the functions outlined below.

The main switching part 30 is configured to selectively supply electrical power from the high voltage battery 10 to electrical field loads within the vehicle in accordance with a control of the battery power management part 40 and is generally formed of relay devices.

The battery power management part 40 is configured to operate synchronously with a high level controller of a vehicle and to manage the high voltage battery 10 in accordance with a command from the high level controller and then to control the supply of electrical power to the electrical field loads of a vehicle. The batter power management part 40 can also be configured to perform a diagnosis function for a vehicle using the insulation resistance sensor 20, the functions of which will be described later with reference to FIGS. 2 to 5.

Figure 2:
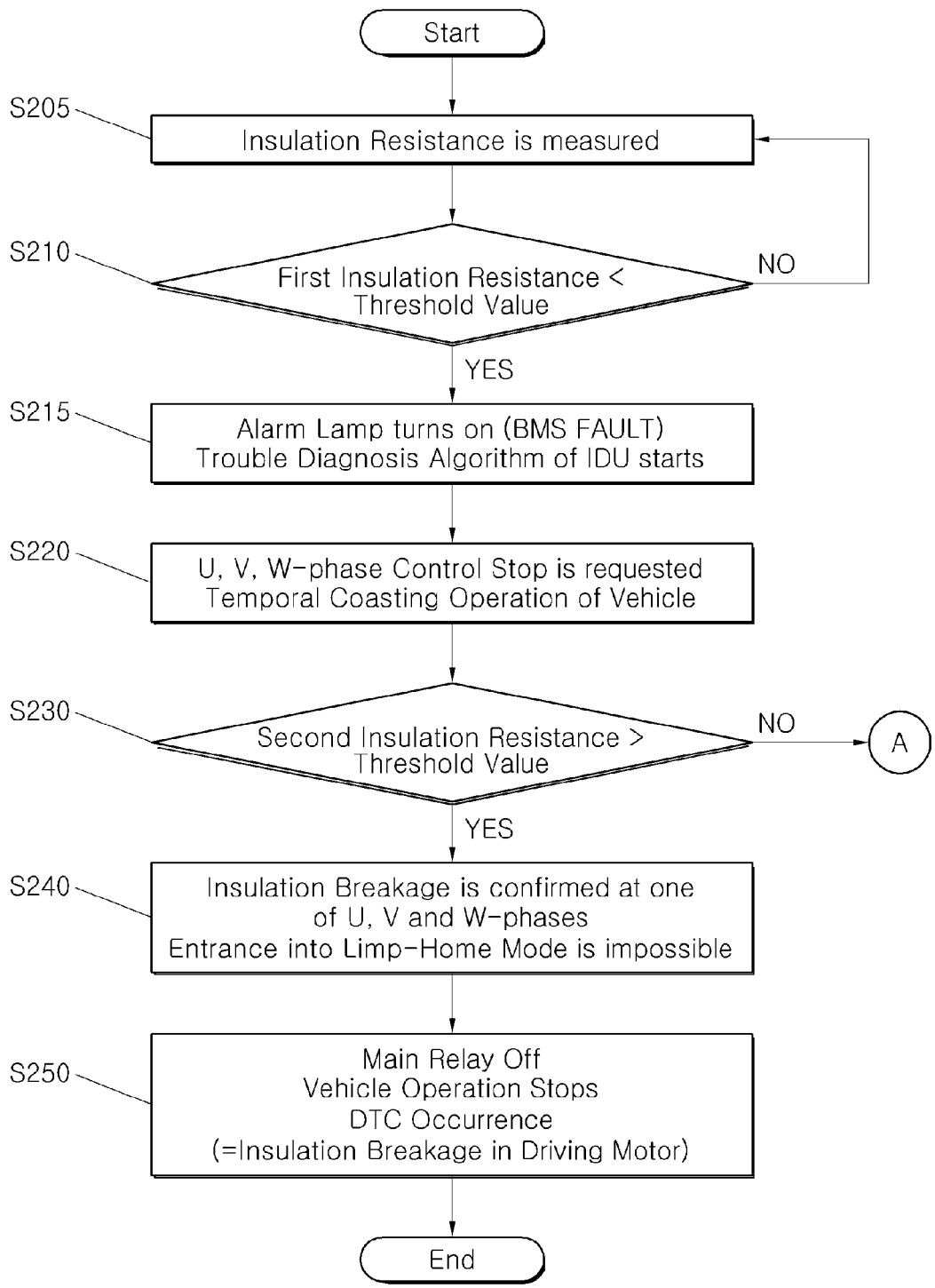
FIG. 2 is a flowchart operated when the insulation is broken in one or more driving components monitored by the diagnosis apparatus according to the exemplary embodiment of the present invention.

FIG. 2 is a flowchart configured to be executed when an insulation is broken in a one or more driving components monitored by the diagnosis apparatus of the illustrative embodiment of the present invention by using an insulation resistance sensor. Referring to FIG. 2, when a first insulation resistance is measured between the high voltage battery 10 for a vehicle and the chassis of the vehicle with the aid of the insulation resistance sensor 20 and is transferred to the battery power management part 40 (S205), the battery power management part 40 monitors the measurement to determine when the value of the transferred first insulation resistance is greater or less than a previously set threshold value (S210).

As a result of the monitoring in S210, when the value of the first insulation resistance is less than the threshold value, the battery power management part 40 generates a first diagnostics trouble code (DTC) to provide warning that a leakage has been generated in a vehicle, and a diagnosis algorithm based on the diagnosis apparatus 1 for a vehicle using an insulation resistance sensor according to the illustrative embodiment of the present invention is disclosed (S215).

The battery power management part 40 transfers a termination request signal of a three-phase (U, V, W) control to the driving part/component 60 so that the operation of the driving part (D driving a motor is terminated (S220). In this case, the vehicle can drive in a "coasting operation mode" where the vehicle slowly rolls to a stop.

Next, the battery power management part 40 determines when the value of a second insulation resistance measured, after terminating operation of the driving part 60, exceeds a threshold value (S230). As a result of the determination, when the value of the second insulation resistance is less than the threshold value, the control procedure of FIGS. 3 and 4, which will be described later, is performed.

As a result of the determination of S230, when the value of the second insulation resistance exceeds the threshold value, the battery power management part 40 determines when an insulation breakage has occurred in the driving part 60 (S240). In this case, it is difficult for the vehicle to operate in a limp-home mode. Therefore, a limp-home mode may not be the best option for the system at this time.

When the battery power management part 4 determines that an insulation breakage has occurred in the driving part 60, the main switching part 30 is turned off, thus disconnecting the electrical supply from the high voltage battery 10 and terminating driving operations of the vehicle, and a second diagnostics trouble code is generated to provide warning that a leakage has occurred in the driving part 60 (S250).

Figure 3:
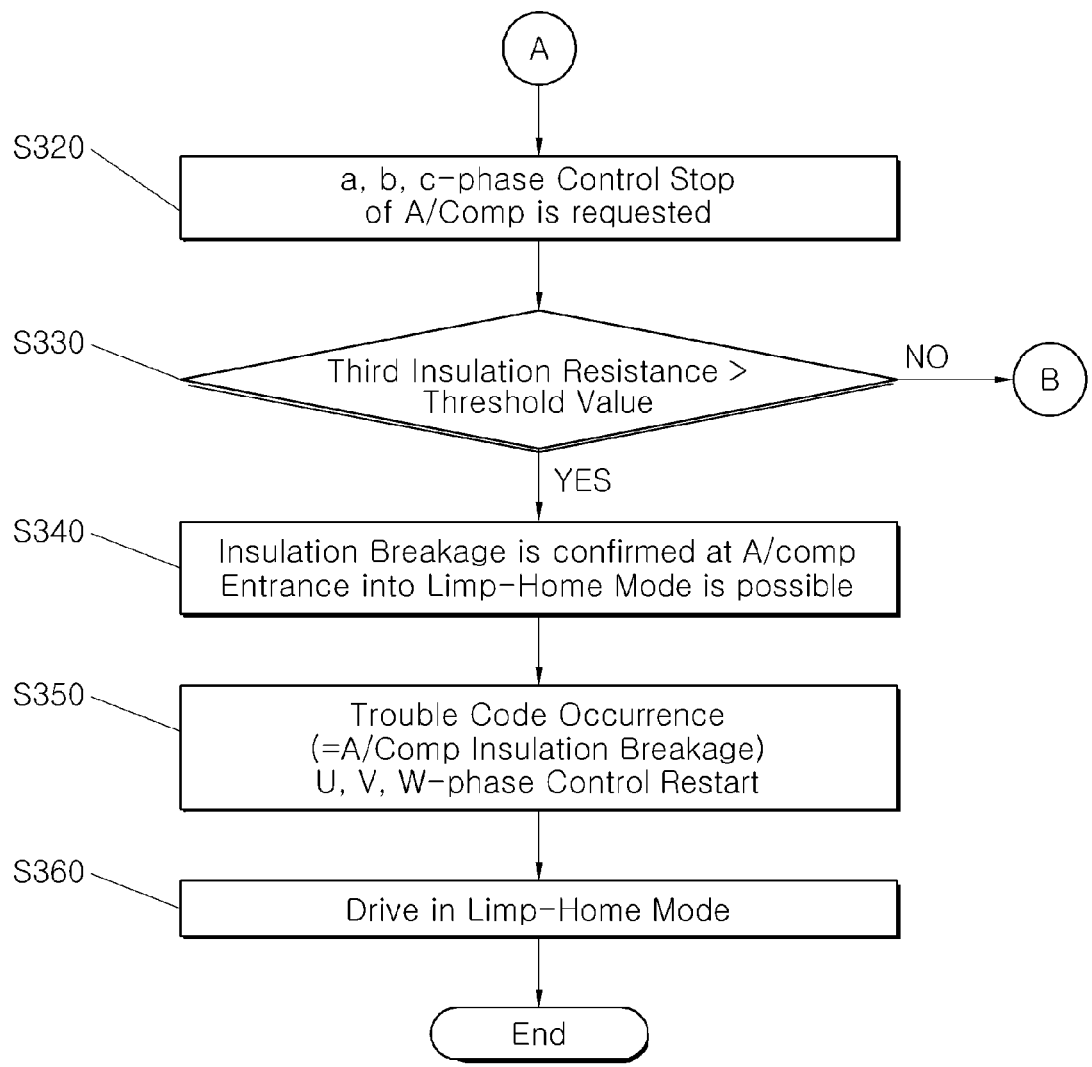
FIG. 3 is a flow chart when the insulation is broken in one of the high voltage elements monitored by the diagnosis apparatus according to the exemplary embodiment of the present invention.
Figure 4:
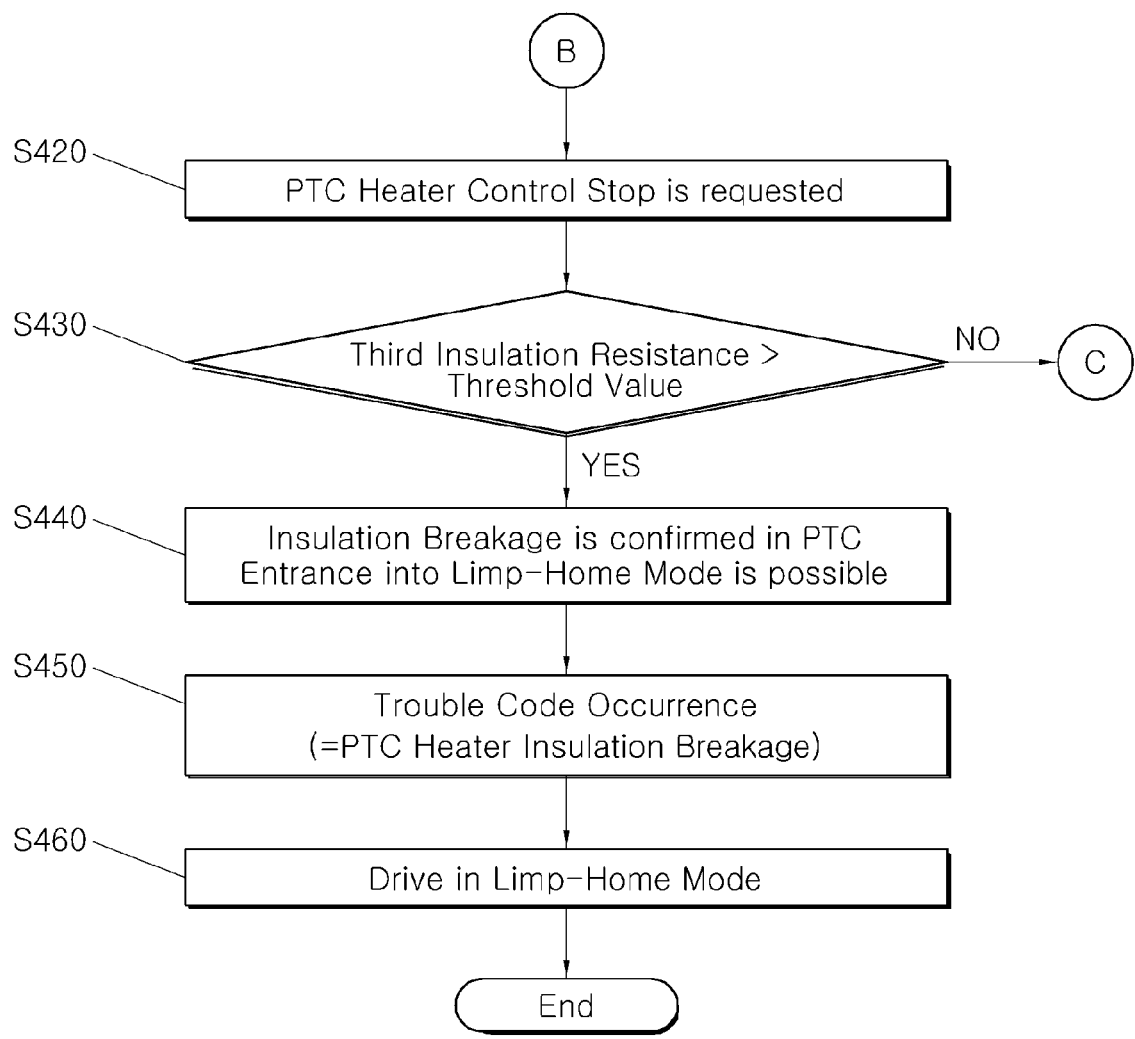
FIG. 4 is a flowchart when the insulation is broken in another one of the high voltage elements monitored by the diagnosis apparatus according to the exemplary embodiment of the present invention.

FIG. 3 is a flowchart configured to be executed when the insulation is broken in an air conditioner compressor which is one of the high voltage elements which may be monitored by the diagnosis apparatus according to the exemplary embodiment of the present invention. FIG. 4 is a flowchart configured to be executed when the insulation is broken in a PTC heater which is another one of the high voltage elements which may be monitored by diagnosis apparatus 1 according to the exemplary embodiment of the present invention.

Referring to FIG. 3, when the value of the second insulation resistance is less than the threshold value in S230, the battery power management part 40 selects any one of the high voltage elements except for driving components associated with the electrical field loads of the vehicle and terminates the operation of the selected high voltage element (S320). FIG. 3 is a flowchart configured to be executed for example when the air conditioner compressor 50 is selected as the high voltage element.

Next, the battery power management part 40 determines when the value of a third insulation resistance measured by the insulation resistance sensor 20 after the operation of the air conditioner compressor 50, which is the selected first high voltage element, is terminated exceeds the threshold value (S330). As a result of the determination of S330, when the value of the third insulation resistance exceeds the threshold value, the battery power management part 40 determines that the insulation has been broken in the air conditioner compressor 50 which is a first high voltage element (S340). In this case, since the insulation is not broken in the driving part 60, the start for the limp-home of a vehicle is possible.

When the battery power management part 40 decides that the insulation has been broken in the air conditioner compressor 50 which is a first high voltage element, it generates a third diagnostics trouble code to provide warning that a leakage has occurred in a first high voltage element (S350). In this case, the vehicle can drive in the limp-home mode (S360).

The control procedure as shown in FIG. 3 can be performed with respect to all the high voltage elements except for the driving part 60. FIG. 4 is a control procedure flow chart when the insulation is broken in a PTC heater among the high voltage elements which belong to the electrical leakage diagnosis apparatus 1 for a vehicle using an insulation resistance sensor according to the embodiment of the present invention.

Referring to FIG. 4, when it is determined in S330 that the air conditioner compressor 50, which is a first high voltage element, is terminated, the battery power management part 40 selects the remaining PTC heater 70 between the two high voltage elements and stops the operation of the PTC heater when the value of the measured third insulation resistance is less than the threshold value (S420).

Next, the battery power management part 40 determines when the value of the third insulation resistance measured by the insulation resistance sensor 20 after the operation of the PTC heater 70, which is the selected high voltage element, is terminated exceeds the threshold value (S430).

As a result of the determination in S430, when the value of the third insulation resistance value after the operation of the PCT heater 70 is terminated exceeds the threshold, the battery power management part 40 determines that the insulation has been broken in the PCT heater (PCT) (S440). In this case, since the driving part 60 is operational, the vehicle may then enter a limp home mode.

When battery power management part is determined that the insulation breakage has occurred in the PCT heater 70 which is a first high voltage element, the battery power management part 40 generates a third diagnostics trouble code to provide warning that a leakage has occurred in the PCT heater 70 (S450). In this case, the vehicle can drive in the limp-home mode (S460).

Figure 5:
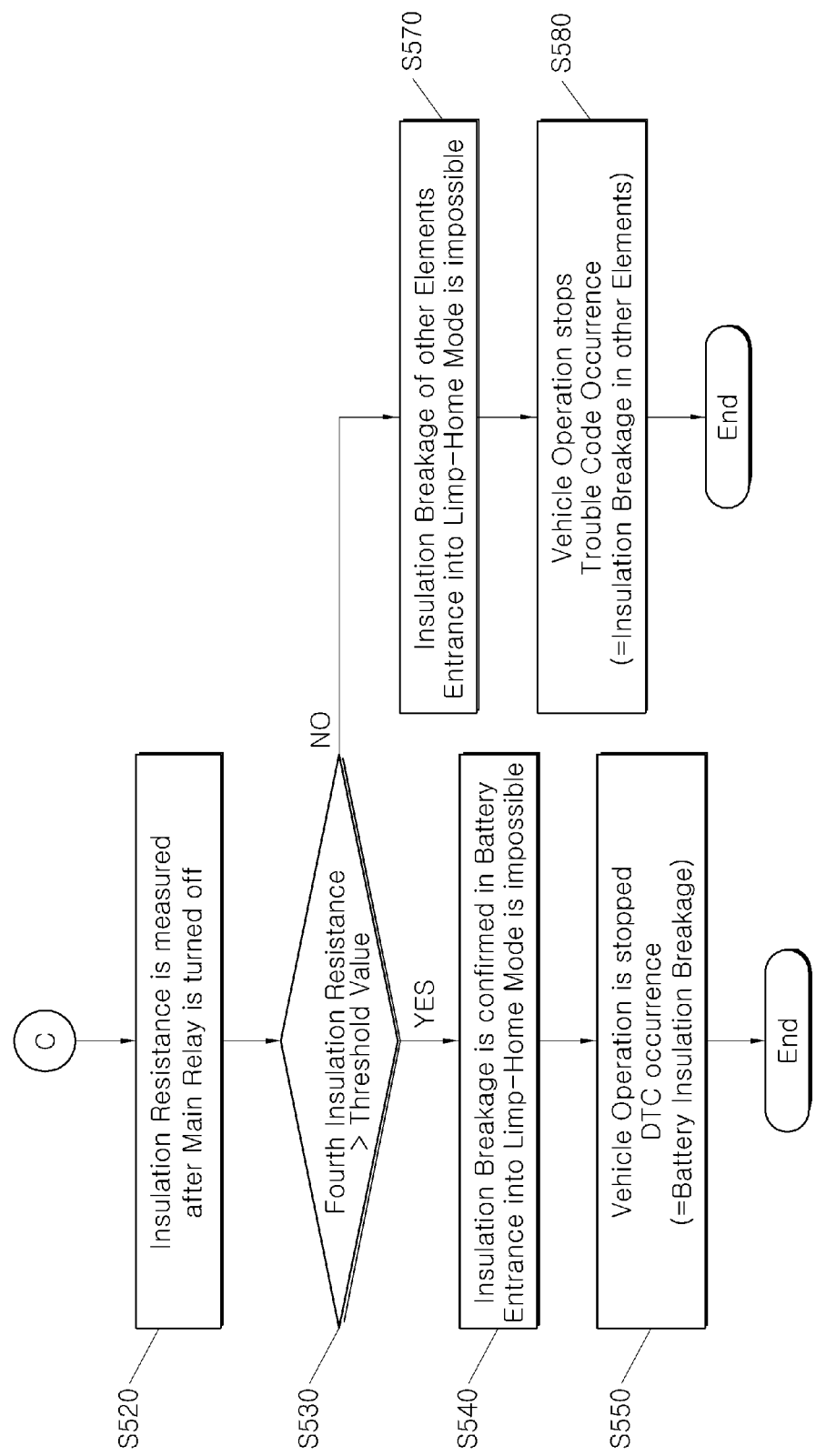
FIG. 5 is a flowchart when the insulation is broken in a voltage battery or other devices monitored by the diagnosis apparatus according to the exemplary embodiment of the present invention.

FIG. 5 is a flowchart when the insulation is broken in a high voltage battery or other devices belonging to an electrical leakage diagnosis apparatus 1 using an insulation resistance sensor according to the embodiment of the present invention.

Referring to FIG. 5, when the value of a third insulation resistance measured after the operation of the air conditioner compressor 50 is terminated and the value of a third insulation resistance measured after the operation of the PTC heater 70 is terminated are less than the threshold value in S330 and S430 are less than the threshold value, respectively, the main switching part 30 is turned off and the electrical power supply from the high voltage resistance is disconnected, and the value of a fourth insulation resistance measured by the insulation resistance sensor 20 is received (S520).

Next, the battery power management part 40 determines when the value of the received fourth insulation resistance exceeds the threshold value (S530). As a result of the above determination, when it is determined that the value of the fourth insulation resistance exceeds the threshold value, it is determined that the insulation has been broken in the high voltage battery 10 (S540). In this case, the use of the power for the sake of driving is no longer possible, the start for the limp-home mode might be impossible.

When the insulation breakage has occurred in the high voltage battery 10, the battery power management part 40 stops the operation of the vehicle and generates a fourth diagnostics trouble code to provide warning that the leakage has occurred in the high voltage battery 10 (S550).

Meanwhile, as a result of the determination in S530, when the value of the fourth insulation resistance is less than the threshold value, the battery power management part 40 determines that the insulation resistance has occurred in the other apparatuses in which the disconnection of the high voltage circuit is impossible in accordance with an electrical control signal in the electrical field loads of the vehicle (S570). Here the other apparatuses might be apparatuses to which the voltage supply from the high voltage battery 10 cannot be disconnected in accordance with an electrical control in the electrical field loads of a vehicle like a cable, etc. Accordingly, the limp-home mode may be difficult to initiate. In this case, the battery power management part 40 terminates the operation of the vehicle when the battery power management part determines that the insulation has been broken in the other apparatuses and generates a fifth diagnostics trouble code to provide warning that a leakage has occurred in the other apparatuses (S580).

As described above, the vehicle electrical leakage diagnosis apparatus 1 using an insulation resistance sensor according to the exemplary embodiment of the present invention makes it possible to identify, by the device, which high voltage element is associated with the broken insulation, so that the vehicle may be operated in a limp home mode when the broken insulation is associated with high voltage elements which are not directly related to the driving operation of the vehicle thereby minimizing the risk of an accident occurring do to the conventional non-dynamic system.

Additionally, the illustrative embodiment of the present invention is able to identify and determine which apparatus or high voltage elements are associated with the such as a driving component or part, an air conditioner compressor, a PTC heater, etc., and a leakage warning can be issued by the device, thus the device's notification and diagnosis features.

While Although the preferred embodiments of the present invention has have been illustrated disclosed for illustrative purposes, and described with reference to specific embodiments, it is apparent to those skilled in the art will appreciate that various modifications, additions, and substitutions are possible, to which the present invention pertains that the present invention may be variously improved and changed without departing from the scope and spirit of the present invention as disclosed in the accompanying claims.

What is claimed is:

1. An electrical leakage diagnosis apparatus for a vehicle, comprising:
   a plurality of insulation resistors arranged between a chassis of the vehicle and one or more driving components or electrical field loads;
   an insulation resistance sensor configured to measure insulation resistances from the plurality of insulation resistors and output the measured insulation resistances;
   a main switching part configured to selectively supply electrical power from a high voltage battery to the one or more driving components or electrical field loads; and
   a battery power management part configured to terminate operation of the one or more driving components to control a driving motor of the vehicle when the value of a first insulation resistance output from the insulation resistance sensor is less than a previously set threshold value, and to determine that an insulation breakage has occurred in the one or more driving components when the value of a second insulation resistance, measured after the one or more driving components has been terminated, exceeds a threshold value and to terminate the operation of the vehicle by turning off the main switching part so that electrical power supplied from the high voltage battery to the electrical field loads of the vehicle is disconnected,
   wherein the first and second insulation resistances are values measured between the high voltage battery and the chassis, and
   the battery power management part is configured to terminate sequentially any one of a plurality of high voltage elements except for the one or more driving components in the electrical field loads when the value of the second insulation resistance is less than the threshold value.

2. The apparatus of claim 1, wherein the battery power management part is configured to generate a first diagnostics trouble code to provide warning that the leakage has occurred in the vehicle before terminating the one or more driving components when the value of the first insulation resistance from the insulation resistance sensor is less than the threshold value.

3. The apparatus of claim 1, wherein the battery power management part is configured to generate a second diagnostics trouble code to provide warning that the leakage has occurred in the one or more driving components, after operation of the vehicle has been terminated, by turning off the main switching part.

4. The apparatus of claim 1, wherein the battery power management part is configured to terminate the operation of a selected first high voltage element of the plurality of high voltage elements, and to determine that an insulation breakage has occurred in the first high voltage element when the value of a third insulation resistance measured by the insulation resistance sensor, after operation of the first high voltage element is terminated, exceeds the threshold value, and to reinitiate operation of the one or more driving components once the batter power management part has determined that the insulation breakage has occurred in the first high voltage element.

5. The apparatus of claim 4, wherein the battery power management part is configured to generate a third diagnostics trouble code to provide warning that a leakage has occurred in the first high voltage element before reinitiating operation of the one or more driving components, when the battery power management part determines that the insulation resistance has occurred in the first high voltage element.

6. The apparatus of claim 4, wherein the battery power management part is configured to disconnect an electrical power supply from the high voltage battery when the value of the third insulation resistance is less than the threshold value with respect to a corresponding high voltage element, and to receive a fourth insulation resistance measured by the insulation resistance senor after the electrical power supply from the high voltage battery is disconnected, and to terminate the operation of the vehicle when it is determined that the insulation breakage has occurred in the high voltage battery as the value of the received fourth insulation resistance exceeds the threshold value.

7. The apparatus of claim 6, wherein the battery power management part is configured to generate a fourth diagnostics trouble code to provide warning that the leakage has occurred in the high voltage battery after the operation of the vehicle has been terminated when the battery power management part determines that the insulation breakage has occurred in the high voltage battery.

8. The apparatus of claim 6, wherein the battery power management part is configured to determine that an insulation breakage has occurred in other devices, in which the disconnection of the high voltage circuit is impossible, in accordance with an electrical control in the electrical field loads of the vehicle when the value of the fourth insulation resistance is below the threshold value and then to terminate the operation of the vehicle as a result of the determination.

9. The apparatus of claim 8, wherein the battery power management part is configured to generate a fifth diagnostics trouble code to provide warning that the leakage has occurred in the other apparatuses after the operation of the vehicle has been terminated when the battery power management part determines that the insulation breakage has occurred in the other apparatuses.

10. An electrical leakage diagnosis method for a vehicle using an insulation resistance sensor, comprising:
   (a) receiving, by a battery power management part, a first insulation resistance measured between a high voltage battery and a chassis of the vehicle;
   (b) terminating, by the battery power management part, one or more operations of one or more driving components to control a driving motor of the vehicle when the value of the received first insulation resistance is less than a previously set threshold value;
   (c) determining, by the battery power management part, when the value of a second insulation resistance, measured after terminating the one or more operations of the one or more driving components, exceeds the threshold value;
   (d) determining that an insulation breakage has occurred in the one or more driving components when the value of the second insulation resistance exceeds the threshold value; and
   (e) terminating operation of the vehicle by disconnecting an electrical power supply from the high voltage battery when the battery power management part determines that the insulation breakage has occurred in one or more of the driving components,
   wherein the first and second insulation resistances are values measured between the high voltage battery and the chassis, and
   the battery power management part is configured to terminate sequentially any one of a plurality of high voltage elements except for the one or more driving components in electrical field loads when the value of the second insulation resistance is less than the threshold value.

11. The method of claim 10, further comprising:
   (c1) selecting any one of a plurality of high voltage elements except for the one or more driving components in the electrical field loads of the vehicle when the value of the second insulation resistance is less than the threshold value as a result of the determination (c) and terminating operation of the selected first high voltage element;
   (c2) determining when the value of a third insulation resistance, measured after terminating the first high voltage element, exceeds the threshold value;
   (c3) determining that the insulation breakage has occurred in the first high voltage element when the value of the third insulation resistance exceeds the threshold value as a result of the determination (c2); and
   (c4) reinitiating operation of the one or more driving components, the operation of which has terminated in (b), when the battery power management part determines that the insulation breakage has occurred in the first high voltage element.

12. The method of claim 11, further comprising:
   receiving the value of a fourth insulation resistance measured after the electrical power supply from the high voltage battery is disconnected, when the value of the third insulation resistance is less than the threshold value as a result of (c1) and (c2) which are sequentially performed with respect to the high voltage elements except for the one or more driving components in the electrical field loads of the vehicle;
   determining when the value of the received fourth insulation resistance exceeds the threshold value;
   determining that the insulation breakage has occurred in the high voltage battery when the value of the fourth insulation resistance exceeds the threshold value; and
   terminating operation of the vehicle when the insulation breakage has occurred in the high voltage battery.

13. The method of claim 12, further comprising:
   determining that the insulation breakage has occurred in other apparatuses, in which the disconnection of the high voltage circuit is impossible, in accordance with an electrical control in the electrical field loads of the vehicle when the value of the fourth insulation resistance is less than the threshold value; and
   terminating operation of the vehicle when the insulation breakage has occurred in the other apparatuses.

14. A non-transitory computer readable medium containing program instructions executed by a processor or controller, the computer readable medium comprising:
   program instructions that receive a first insulation resistance measured between a high voltage battery and a chassis of a vehicle;
   program instructions that terminate one or more operations of one or more driving components to control a driving motor of the vehicle when the value of the received first insulation resistance is less than a previously set threshold value;
   program instructions that determine when the value of a second insulation resistance, measured after terminating the one or more operations of the one or more driving components, exceeds the threshold value;
   program instructions that determine that an insulation breakage has occurred in the one or more driving components when the value of the second insulation resistance exceeds the threshold value; and
   program instructions that terminate operation of the vehicle by disconnecting an electrical power supply from the high voltage battery when the battery power management part determines that the insulation breakage has occurred in one or more of the driving components,
   wherein the first and second insulation resistances are values measured between the high voltage battery and the chassis, and
   the battery power management part is configured to terminate sequentially any one of a plurality of high voltage elements except for the one or more driving components in electrical field loads when the value of the second insulation resistance is less than the threshold value.

15. The method of claim 14, further comprising:

program instructions that select any one of a plurality of high voltage elements except for the one or more driving components in the electrical field loads of the vehicle when the value of the second insulation resistance is less than the threshold value and terminate operation of the selected first high voltage element;

program instructions that determine when the value of a third insulation resistance, measured after terminating the first high voltage element, exceeds the threshold value;

program instructions that determine that the insulation breakage has occurred in the first high voltage element when the value of the third insulation resistance exceeds the threshold value; and program instructions that reinitiate operation of the one or more driving components, the operation of which has been previously terminated, when the battery power management part determines that the insulation breakage has occurred in the first high voltage element.

* * * * *